United States Patent
Wang

(10) Patent No.: US 10,353,258 B2
(45) Date of Patent: Jul. 16, 2019

(54) LIQUID CRYSTAL DISPLAY PANEL AND LIQUID CRYSTAL DISPLAY DEVICE

(71) Applicant: WUHAN CHINA STAR OPTOELECTRONICS TECHNOLOGY CO., LTD., Wuhan (CN)

(72) Inventor: Cong Wang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 84 days.

(21) Appl. No.: 15/317,930

(22) PCT Filed: Jul. 12, 2016

(86) PCT No.: PCT/CN2016/089723
§ 371 (c)(1),
(2) Date: Dec. 9, 2016

(87) PCT Pub. No.: WO2018/000451
PCT Pub. Date: Jan. 4, 2018

(65) Prior Publication Data
US 2018/0210303 A1    Jul. 26, 2018

(30) Foreign Application Priority Data

Jun. 27, 2016 (CN) .......................... 2016 1 0482529

(51) Int. Cl.
*G02F 1/1362* (2006.01)
*G09G 3/36* (2006.01)
*H01L 27/12* (2006.01)

(52) U.S. Cl.
CPC ...... *G02F 1/136286* (2013.01); *G02F 1/1362* (2013.01); *G09G 3/3614* (2013.01); *G09G 3/3648* (2013.01); *G09G 3/3688* (2013.01); *H01L 27/124* (2013.01); *G09G 2310/0205* (2013.01)

(58) Field of Classification Search
CPC ............. G02F 1/136286; G02F 1/1362; H01L 27/124; G09G 3/3614; G09G 3/3648; G09G 3/3688
See application file for complete search history.

(56) References Cited

U.S. PATENT DOCUMENTS

| | | | | |
|---|---|---|---|---|
| 2008/0100562 | A1* | 5/2008 | Huang | G02F 1/13362 345/102 |
| 2009/0322660 | A1* | 12/2009 | Chung | G09G 3/3648 345/87 |
| 2017/0154588 | A1* | 6/2017 | Du | G09G 3/3614 |

FOREIGN PATENT DOCUMENTS

| | | |
|---|---|---|
| CN | 101903938 A | 12/2010 |
| CN | 103185996 A | 7/2013 |

(Continued)

*Primary Examiner* — Leon Flores
(74) *Attorney, Agent, or Firm* — Muncy, Geissler, Olds & Lowe, P.C.

(57) ABSTRACT

The present invention provides a liquid crystal display panel including data lines that includes first data lines and second data lines, (2n+1)th row pixel units and (2n+2)th row pixel units connect with a same one of the scan lines. (2n+1)th column pixel units of the (2n+1)th row connect with the first data line, (2n+2)th column pixel units of the (2n+1)th row connect with the second data line, (2n+1)th column pixel units of the (2n+2)th row connect with the second data line, (2n+2)th column pixel units of the (2n+2)th row connect with the first data line.

16 Claims, 1 Drawing Sheet

(56) References Cited

FOREIGN PATENT DOCUMENTS

| CN | 104849890 A | 8/2015 |
| CN | 105185332 A | 12/2015 |

\* cited by examiner

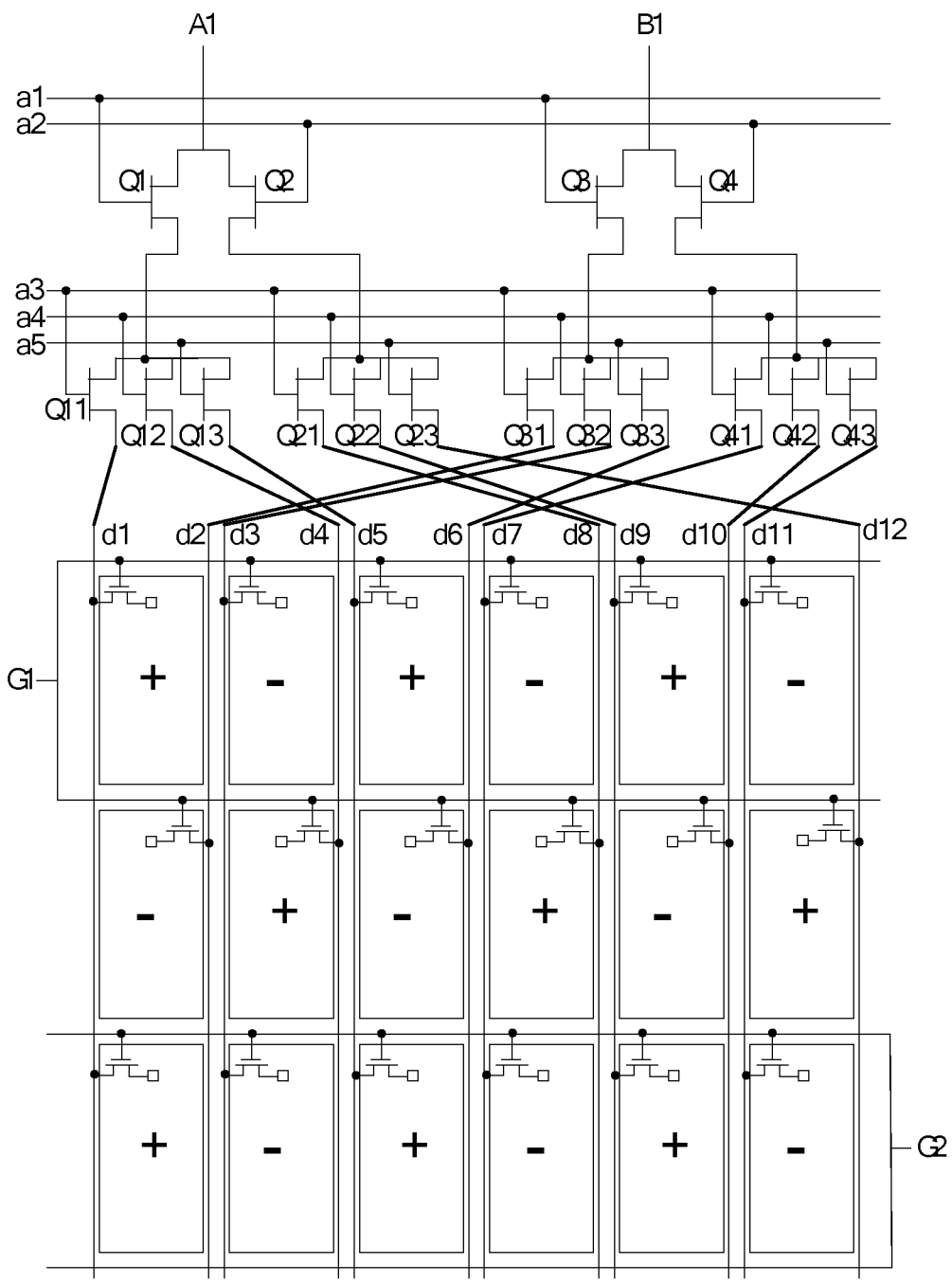

LIQUID CRYSTAL DISPLAY PANEL AND LIQUID CRYSTAL DISPLAY DEVICE

BACKGROUND OF THE INVENTION

Field of Invention

The present invention relates to the field of liquid crystal display (LCD) technology, and more particularly to an LCD panel and an LCD device.

Description of Prior Art

With technical development, people are asking for more and more multimedia content, such as hi-fi music, high resolution movies, and more realistic images. Hence, in order to raise display quality of the multimedia, users want for the LCD panel to have a high resolution, a high brightness, a long viewing time and a narrow bezel.

A typical LCD panel uses one scan line to control one row of pixels, which requires more scan lines for a high resolution LCD panel which increases bezel size of the LCD panel, thus influencing narrow bezel or no bezel designs.

Hence, it is need to provide an LCD panel and an LCD device, to solve the problem of the typical art.

SUMMARY OF THE INVENTION

The embodiment of the present application provide an LCD panel and an LCD device which is able to better implement the narrow bezel design or the non-bezel design; to solve the technical problem about image caused by the driving circuit of the LCD panel and LCD device, while applying to the narrow bezel design or the non-bezel design.

The present invention provides a LCD panel, which comprises data lines, scan lines, and pixel units disposed between the data lines and the scan lines; the data lines comprise first data lines and second data lines.

(2n+1)th row pixel units and (2n+2)th row pixel units connect with the same one of the scan lines.

(2n+1)th column pixel units of the (2n+1)th row connect with the first data line. (2n+2)th column pixel units of the (2n+1)th row connect with the second data line. (2n+1)th column pixel units of the (2n+2)th row connect with the second data line. (2n+2)th column pixel units of the (2n+2)th row connect with the first data line.

The first data line and the second data line are disposed on different sides of the corresponding pixel unit.

A polarity of data signal of the first data line and a polarity of data signal of the second data line are inverted.

The LCD panel further comprises data-line driving circuit.

The data-line driving circuit comprises a positive polarity signal source, a negative polarity signal source, a first level positive polarity switch, a first level negative polarity switch, a first level control signal line, a second level positive polarity switch, a second level negative polarity switch and a second level control signal line.

An input terminal of the first level positive polarity switch connects with the positive polarity signal source, a control terminal of the first level positive polarity switch connects with first level control signal line, an output terminal of the first level positive polarity switch connects with an input terminal of the second level positive polarity switch.

An input terminal of the first level negative polarity switch connects with the negative polarity signal source, a control terminal of the first level negative polarity switch connects with the first level control signal line, an output terminal of the first level negative polarity switch connects with an input terminal of the second level negative polarity switch.

A control terminal of the second level positive polarity switch connects with the second level control signal line, an output terminal of the second level positive polarity switch connects with the first data line.

A control terminal of the second level negative polarity switch connects with the second level control signal line, an output terminal of the second level negative polarity switch connects with the second data line.

In the LCD panel of the present invention, the positive polarity source corresponds with at least two of the first level positive polarity switches, the negative polarity source corresponds with at least two of the second level negative polarity switches.

In the LCD panel of the present invention, each of the first level positive polarity switch corresponds at least two of the second positive polarity switches, each of the first level negative polarity switch corresponds at least two of the second negative polarity switches.

In the LCD panel of the present invention, the data-line driving circuit comprises one of the positive polarity signal source, one of the negative polarity signal source, two of the first level positive polarity switch, two of the first level negative polarity switch, two of the first level control signal line, six of the second level positive polarity switch, six of the second level negative polarity switch and six of the second level control signal line.

The present invention further provides a LCD panel, which comprises data lines, scan lines, and pixel units disposed between the data lines and the scan lines; the data lines comprise first data lines and second data lines.

(2n+1)th row pixel units and (2n+2)th row pixel units connect with the same one of the scan lines.

(2n+1)th column pixel units of the (2n+1)th row connect with the first data line. (2n+2)th column pixel units of the (2n+1)th row connect with the second data line. (2n+1)th column pixel units of the (2n+2)th row connect with the second data line. (2n+2)th column pixel units of the (2n+2)th row connect with the first data line.

The first data line and the second data line are disposed on different sides of the corresponding pixel unit.

In the LCD panel of the present invention, a polarity of data signal of the first data line and a polarity of data signal of the second data line are inverted.

In the LCD panel of the present invention, the LCD panel further comprises data-line driving circuit.

The data-line driving circuit comprises a positive polarity signal source, a negative polarity signal source, a first level positive polarity switch, a first level negative polarity switch, a first level control signal line, a second level positive polarity switch, a second level negative polarity switch and a second level control signal line.

An input terminal of the first level positive polarity switch connects with the positive polarity signal source, a control terminal of the first level positive polarity switch connects with first level control signal line, an output terminal of the first level positive polarity switch connects with an input terminal of the second level positive polarity switch.

An input terminal of the first level negative polarity switch connects with the negative polarity signal source, a control terminal of the first level negative polarity switch connects with the first level control signal line, an output terminal of the first level negative polarity switch connects with an input terminal of the second level negative polarity switch.

A control terminal of the second level positive polarity switch connects with the second level control signal line, an output terminal of the second level positive polarity switch connects with the first data line.

A control terminal of the second level negative polarity switch connects with the second level control signal line, an output terminal of the second level negative polarity switch connects with the second data line.

In the LCD panel of the present invention, the positive polarity source corresponds with at least two of the first level positive polarity switches, the negative polarity source corresponds with at least two of the second level negative polarity switches.

In the LCD panel of the present invention, each of the first level positive polarity switch corresponds at least two of the second positive polarity switches, each of the first level negative polarity switch corresponds at least two of the second negative polarity switches.

In the LCD panel of the present invention, the data-line driving circuit comprises one of the positive polarity signal source, one of the negative polarity signal source, two of the first level positive polarity switch, two of the first level negative polarity switch, two of the first level control signal line, six of the second level positive polarity switch, six of the second level negative polarity switch and six of the second level control signal line.

The present invention further provides a LCD device, which comprises which comprises a LCD panel and a backlight module. The LCD panel comprises data lines, scan lines, and pixel units disposed between the data lines and the scan lines; the data lines comprise first data lines and second data lines.

(2n+1)th row pixel units and (2n+2)th row pixel units connect with the same one of the scan lines.

(2n+1)th column pixel units of the (2n+1)th row connect with the first data line. (2n+2)th column pixel units of the (2n+1)th row connect with the second data line. (2n+1)th column pixel units of the (2n+2)th row connect with the second data line. (2n+2)th column pixel units of the (2n+2)th row connect with the first data line.

The first data line and the second data line are disposed on different sides of the corresponding pixel unit.

In the LCD device of the present invention, a polarity of data signal of the first data line and a polarity of data signal of the second data line are inverted.

In the LCD device of the present invention, the LCD panel further comprises data-line driving circuit.

The data-line driving circuit comprises a positive polarity signal source, a negative polarity signal source, a first level positive polarity switch, a first level negative polarity switch, a first level control signal line, a second level positive polarity switch, a second level negative polarity switch and a second level control signal line.

An input terminal of the first level positive polarity switch connects with the positive polarity signal source, a control terminal of the first level positive polarity switch connects with first level control signal line, an output terminal of the first level positive polarity switch connects with an input terminal of the second level positive polarity switch.

An input terminal of the first level negative polarity switch connects with the negative polarity signal source, a control terminal of the first level negative polarity switch connects with the first level control signal line, an output terminal of the first level negative polarity switch connects with an input terminal of the second level negative polarity switch.

A control terminal of the second level positive polarity switch connects with the second level control signal line, an output terminal of the second level positive polarity switch connects with the first data line.

A control terminal of the second level negative polarity switch connects with the second level control signal line, an output terminal of the second level negative polarity switch connects with the second data line.

In the LCD device of the present invention, the positive polarity source corresponds with at least two of the first level positive polarity switches, the negative polarity source corresponds with at least two of the second level negative polarity switches.

In the LCD device of the present invention, each of the first level positive polarity switch corresponds at least two of the second positive polarity switches, each of the first level negative polarity switch corresponds at least two of the second negative polarity switches.

In the LCD device of the present invention, the data-line driving circuit comprises one of the positive polarity signal source, one of the negative polarity signal source, two of the first level positive polarity switch, two of the first level negative polarity switch, two of the first level control signal line, six of the second level positive polarity switch, six of the second level negative polarity switch and six of the second level control signal line.

Compared with the typical LCD panel and LCD device, the LCD panel and LCD device of the present invention can effectively reduce the quantity of scan line to better implement the narrow bezel design or the non-bezel design of the LCD panel, by disposing the first data line and the second data line; to solve the technical problem about image caused by the driving circuit of the LCD panel and LCD device, while applying to the narrow bezel design or the non-bezel design.

BRIEF DESCRIPTION OF THE DRAWINGS

In order to more clearly illustrate the technical solutions of the embodiments of the present invention or the prior art, the following are simple description to the drawings used in the embodiments. The following drawing is only some examples of the present invention, those ordinary skilled in the art can get other drawings from these drawings without creative efforts premise.

FIG. 1 is a structural illustrative diagram of a preferred embodiment of the LCD panel of the present invention.

DETAILED DESCRIPTION OF THE PREFERRED EMBODIMENTS

Please refer to the drawings, wherein the same component characters indicate the same components. The following description is based on the specific embodiment of the present invention, which should not be construed as limiting the present invention in other specific embodiments which are not described in detail.

FIG. 1 is a structural illustrative diagram of a preferred embodiment of the LCD panel of the present invention.

The LCD panel of the preferred embodiment comprises data lines, scan lines, pixel units disposed between the data lines and the scan lines, and a data-line driving circuit. The data lines comprise first data lines and second data lines. A polarity of data signal of the first data line and a polarity of data signal of the second data line are inverted. The data-line driving circuit is used to provide data signal to the first data line and the second data line.

(2n+1)th row pixel units and (2n+2)th row pixel units connect with a same one of the scan lines. (2n+1)th column pixel units of the (2n+1)th row connect with the first data line. (2n+2)th column pixel units of the (2n+1)th row connect with the second data line. (2n+1)th column pixel units of the (2n+2)th row connect with the second data line. (2n+2)th column pixel units of the (2n+2)th row connect with the first data line.

The first data line and the second data line are disposed on different sides of the corresponding pixel unit.

The data-line driving circuit in FIG. 1 comprises a positive polarity signal source A1, a negative polarity signal source B1, a first level positive polarity switch (Q1, Q2), a first level negative polarity switch (Q3, Q4), a first level control signal line (a1, a2), a second level positive polarity switch (Q11, Q12, Q13, Q21, Q22, Q23), a second level negative polarity switch (Q31, Q32, Q33, Q41, Q42, Q43) and a second level control signal line (a3, a4, a5).

An input terminal of the first level positive polarity switch Q2 connects with the positive polarity signal source A1, a control terminal of the first level positive polarity switch Q2 connects with first level control signal line a2, an output terminal of the first level positive polarity switch Q2 connects with an input terminal of the second level positive polarity switch (Q21, Q22, Q23).

An input terminal of the first level negative polarity switch Q3 connects with the negative polarity signal source B1, a control terminal of the first level negative polarity switch Q3 connects with the first level control signal line a2, an output terminal of the first level negative polarity switch Q3 connects with an input terminal of the second level negative polarity switch (Q31, Q32, Q33).

An input terminal of the first level negative polarity switch Q4 connects with the negative polarity signal source B1, a control terminal of the first level negative polarity switch Q4 connects with the first level control signal line a2, an output terminal of the first level negative polarity switch Q4 connects with an input terminal of the second level negative polarity switch (Q41, Q42, Q43).

A control terminal of the second level positive polarity switch Q11 connects with the second level control signal line a3, an output terminal of the second level positive polarity switch Q11 connects with the first data line d1.

A control terminal of the second level positive polarity switch Q12 connects with the second level control signal line a4, an output terminal of the second level positive polarity switch Q12 connects with the first data line d4.

A control terminal of the second level positive polarity switch Q13 connects with the second level control signal line a5, an output terminal of the second level positive polarity switch Q13 connects with the first data line d5.

A control terminal of the second level positive polarity switch Q21 connects with the second level control signal line a3, an output terminal of the second level positive polarity switch Q21 connects with the first data line d8.

A control terminal of the second level positive polarity switch Q22 connects with the second level control signal line a4, an output terminal of the second level positive polarity switch Q22 connects with the first data line d9.

A control terminal of the second level positive polarity switch Q23 connects with the second level control signal line a5, an output terminal of the second level positive polarity switch Q23 connects with the first data line d12.

A control terminal of the second level positive polarity switch Q31 connects with the second level control signal line a3, an output terminal of the second level positive polarity switch Q31 connects with the first data line d2.

A control terminal of the second level positive polarity switch Q32 connects with the second level control signal line a4, an output terminal of the second level positive polarity switch Q32 connects with the first data line d3.

A control terminal of the second level positive polarity switch Q33 connects with the second level control signal line a5, an output terminal of the second level positive polarity switch Q33 connects with the first data line d6.

A control terminal of the second level positive polarity switch Q41 connects with the second level control signal line a3, an output terminal of the second level positive polarity switch Q41 connects with the first data line d7.

A control terminal of the second level positive polarity switch Q42 connects with the second level control signal line a4, an output terminal of the second level positive polarity switch Q42 connects with the first data line d10.

A control terminal of the second level positive polarity switch Q43 connects with the second level control signal line a5, an output terminal of the second level positive polarity switch Q43 connects with the first data line d11.

When the LCD panel of the preferred embodiment performs image display, first, the scan line G1 inputs a high voltage level signal, the thin film transistors (TFT) of the first row pixel units and the second row pixel units conduct.

When the scan line G1 inputs a high voltage level signal, the first level control signal line a1 and the second level control signal line a3 are first inputted with high voltage level, then the second level positive polarity switch Q11, the first level positive polarity switch Q1, the second level negative polarity switch Q31, and the first level negative polarity switch Q3 conduct. The pixel unit of the first row and the first column connects with the positive polarity signal source A1 by the first data line d1, the second level positive polarity switch Q11, and the first positive polarity switch Q1. The pixel unit of the second row and the first column connects with the negative polarity signal source B1 by the second data line d2, the second level negative polarity switch Q31, the first negative polarity switch Q3.

Then, the first level control signal line a1 and the second level control signal line a4 are input with high voltage level, then, the second level positive polarity switch Q12, the first level positive polarity switch Q1, the second level negative polarity switch Q32, and the first level negative polarity switch Q3 conduct. The pixel unit of the second row and the second column connects with the positive polarity signal source A1 by the first data line d4, the second level positive polarity switch Q12, and the first positive polarity switch Q1. The pixel unit of the first row and the second column connects with the negative polarity signal source B1 by the second data line d3, the second level negative polarity switch Q32, the first negative polarity switch Q3.

Then, the first level control signal line a1 and the second level control signal line a5 are input with high voltage level, then, the second level positive polarity switch Q13, the first level positive polarity switch Q1, the second level negative polarity switch Q33, and the first level negative polarity switch Q3 conduct. The pixel unit of the first row and the third column connects with the positive polarity signal source A1 by the first data line d5, the second level positive polarity switch Q13, and the first positive polarity switch Q1. The pixel unit of the second row and the third column connects with the negative polarity signal source B1 by the second data line d6, the second level negative polarity switch Q33, the first negative polarity switch Q3.

Then, the first level control signal line a2 and the second level control signal line a3 are input with high voltage level, the first level control signal line a1 and the second level control signal line a5 are input with low voltage level, then, the second level positive polarity switch Q21, the first level positive polarity switch Q2, the second level negative polarity switch Q41, and the first level negative polarity switch Q4 conduct. The pixel unit of the second row and the fourth column connects with the positive polarity signal source A1 by the first data line d8, the second level positive polarity switch Q21, and the first positive polarity switch Q2. The pixel unit of the first row and the fourth column connects with the negative polarity signal source B1 by the second data line d7, the second level negative polarity switch Q41, the first negative polarity switch Q4.

Then, the first level control signal line a2 and the second level control signal line a4 are input with high voltage level, the second level control signal line a3 is inputted with low voltage level, then, the second level positive polarity switch Q22, the first level positive polarity switch Q2, the second level negative polarity switch Q42, and the first level negative polarity switch Q4 conduct. The pixel unit of the first row and the fifth column connects with the positive polarity signal source A1 by the first data line d9, the second level positive polarity switch Q22, and the first positive polarity switch Q2. The pixel unit of the second row and the fifth column connects with the negative polarity signal source B1 by the second data line d10, the second level negative polarity switch Q42, the first negative polarity switch Q4.

Then, the first level control signal line a2 and the second level control signal line a5 are input with high voltage level, the second level control signal line a4 is inputted with low voltage level, then, the second level positive polarity switch Q23, the first level positive polarity switch Q2, the second level negative polarity switch Q43, and the first level negative polarity switch Q4 conduct. The pixel unit of the second row and the sixth column connects with the positive polarity signal source A1 by the first data line d12, the second level positive polarity switch Q23, and the first positive polarity switch Q2. The pixel unit of the first row and the sixth column connects with the negative polarity signal source B1 by the second data line d11, the second level negative polarity switch Q43, the first negative polarity switch Q4.

When the pixel units of the first row and the second row finish displaying, the scan line G1 is inputted with a low voltage level signal and the scan line G2 is inputted with a high voltage level signal, to perform image display to the pixel units of the third row and the fourth row, to complete the image operation of the whole pixel units.

In this way, the image display process of the LCD panel of the preferred embodiment completes.

The LCD panel of the preferred embodiment finishes the image display of the twelve pixel units within one frame image by the positive polarity signal source A1 and the negative polarity source B1, in the next frame image, it only needs to change polarities of the positive polarity signal source A1 and the negative polarity source B1, the dot-inversion operation of the LCD panel can be implemented, to effectively improve the display effect of the LCD panel.

The LCD panel of the preferred embodiment can effectively reduce number of scan lines to design LCD panels with narrow bezels or have no bezels, by disposing the first data line and the second data line. The disposition of the dot-inversion of the LCD panel can effectively improve display of the LCD panel.

The present invention further provides a LCD device. The LCD device of the preferred embodiment comprises a LCD panel and a backlight module. The LCD panel comprises data lines, scan lines, pixel units disposed between the data lines and the scan lines, and a data-line driving circuit. The data lines comprise first data lines and second data lines. A polarity of data signal of the first data line and a polarity of data signal of the second data line are inverted. The data-line driving circuit is used to provide data signal to the first data line and the second data line.

(2n+1)th row pixel units and (2n+2)th row pixel units connect with the same one of the scan lines. (2n+1)th column pixel units of the (2n+1)th row connect with the first data line. (2n+2)th column pixel units of the (2n+1)th row connect with the second data line. (2n+1)th column pixel units of the (2n+2)th row connect with the second data line. (2n+2)th column pixel units of the (2n+2)th row connect with the first data line.

The first data line and the second data line are disposed on different sides of the corresponding pixel unit.

Preferably, a polarity of data signal of the first data line and a polarity of data signal of the second data line are inverted.

Preferably, the LCD panel further comprises data-line driving circuit.

The data-line driving circuit comprises a positive polarity signal source, a negative polarity signal source, a first level positive polarity switch, a first level negative polarity switch, a first level control signal line, a second level positive polarity switch, a second level negative polarity switch and a second level control signal line.

An input terminal of the first level positive polarity switch connects with the positive polarity signal source, a control terminal of the first level positive polarity switch connects with first level control signal line, an output terminal of the first level positive polarity switch connects with an input terminal of the second level positive polarity switch.

An input terminal of the first level negative polarity switch connects with the negative polarity signal source, a control terminal of the first level negative polarity switch connects with the first level control signal line, an output terminal of the first level negative polarity switch connects with an input terminal of the second level negative polarity switch.

A control terminal of the second level positive polarity switch connects with the second level control signal line, an output terminal of the second level positive polarity switch connects with the first data line.

A control terminal of the second level negative polarity switch connects with the second level control signal line, an output terminal of the second level negative polarity switch connects with the second data line.

Preferably, the positive polarity source corresponds with at least two of the first level positive polarity switches, the negative polarity source corresponds with at least two of the second level negative polarity switches.

Preferably, each of the first level positive polarity switch corresponds at least two of the second positive polarity switches, each of the first level negative polarity switch corresponds at least two of the second negative polarity switches.

Preferably, the data-line driving circuit comprises one of the positive polarity signal source, one of the negative polarity signal source, two of the first level positive polarity switch, two of the first level negative polarity switch, two of the first level control signal line, six of the second level positive polarity switch, six of the second level negative polarity switch and six of the second level control signal line.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A liquid crystal display (LCD) panel, comprising data lines, scan lines, and pixel units disposed between the data lines and the scan lines; the data lines comprise first data lines and second data lines;
    wherein odd row pixel units and even row pixel units connects with a same one of the scan lines;
    wherein odd column pixel units of the odd row connect with the first data line, even column pixel units of the odd row connect with the second data line, odd column pixel units of the even row connect with the second data line, even column pixel units of the even row connect with the first data line;
    wherein the first data line and the second data line are disposed on different sides of the corresponding pixel unit;
    wherein polarity of data signal of the first data line and polarity of data signal of the second data line are inverted; and
    wherein the LCD panel further comprises a data-line driving circuit, the data-line driving circuit comprises a positive polarity signal source, a negative polarity signal source, a first level positive polarity switch, a first level negative polarity switch, a first level control signal line, a second level positive polarity switch, a second level negative polarity switch and a second level control signal line;
    wherein an input terminal of the first level positive polarity switch connects with the positive polarity signal source, a control terminal of the first level positive polarity switch connects with first level control signal line, an output terminal of the first level positive polarity switch connects with an input terminal of the second level positive polarity switch;
    an input terminal of the first level negative polarity switch connects with the negative polarity signal source, a control terminal of the first level negative polarity switch connects with the first level control signal line, an output terminal of the first level negative polarity switch connects with an input terminal of the second level negative polarity switch;
    a control terminal of the second level positive polarity switch connects with the second level control signal line, an output terminal of the second level positive polarity switch connects with the first data line; and
    a control terminal of the second level negative polarity switch connects with the second level control signal line, an output terminal of the second level negative polarity switch connects with the second data line.

2. The LCD panel according to claim 1, wherein the positive polarity source corresponds with at least two of the first level positive polarity switches, the negative polarity source corresponds with at least two of the second level negative polarity switches.

3. The LCD panel according to claim 2, wherein each of the first level positive polarity switch corresponds at least two of the second positive polarity switches, each of the first level negative polarity switch corresponds at least two of the second negative polarity switches.

4. The LCD panel according to claim 3, wherein the data-line driving circuit comprises one of the positive polarity signal source, one of the negative polarity signal source, two of the first level positive polarity switch, two of the first level negative polarity switch, two of the first level control signal line, six of the second level positive polarity switch, six of the second level negative polarity switches, and six of the second level control signal lines.

5. A liquid crystal display (LCD) panel, comprising data lines, scan lines, and pixel units disposed between the data lines and the scan lines; the data lines comprise first data lines and second data lines;
    wherein each of odd row pixel units and even row pixel units connects with a same one of the scan lines;
    wherein odd column pixel units of the odd row connect with the first data line, even column pixel units of the odd row connect with the second data line, odd column pixel units of the even row connect with the second data line, even column pixel units of the even row connect with the first data line; and
    wherein the first data line and the second data line are disposed on different sides of the corresponding pixel unit.

6. The LCD panel according to claim 5, wherein a polarity of data signal of the first data line and a polarity of data signal of the second data line are inverted.

7. The LCD panel according to claim 5, wherein the LCD panel further comprises a data-line driving circuit, the data-line driving circuit comprises a positive polarity signal source, a negative polarity signal source, a first level positive polarity switch, a first level negative polarity switch, a first level control signal line, a second level positive polarity switch, a second level negative polarity switch and a second level control signal line;
    wherein an input terminal of the first level positive polarity switch connects with the positive polarity signal source, a control terminal of the first level positive polarity switch connects with first level control signal line, an output terminal of the first level positive polarity switch connects with an input terminal of the second level positive polarity switch;
    wherein an input terminal of the first level negative polarity switch connects with the negative polarity signal source, a control terminal of the first level negative polarity switch connects with the first level control signal line, an output terminal of the first level negative polarity switch connects with an input terminal of the second level negative polarity switch;
    wherein a control terminal of the second level positive polarity switch connects with the second level control signal line, an output terminal of the second level positive polarity switch connects with the first data line; and
    wherein a control terminal of the second level negative polarity switch connects with the second level control signal line, an output terminal of the second level negative polarity switch connects with the second data line.

8. The LCD panel according to claim 7, wherein the positive polarity source corresponds with at least two of the first level positive polarity switches, the negative polarity source corresponds with at least two of the second level negative polarity switches.

9. The LCD panel according to claim 8, wherein each of the first level positive polarity switch corresponds at least two of the second positive polarity switches, each of the first level negative polarity switch corresponds at least two of the second negative polarity switches.

10. The LCD panel according to claim 9, wherein the data-line driving circuit comprises one of the positive polarity signal source, one of the negative polarity signal source, two of the first level positive polarity switch, two of the first level negative polarity switch, two of the first level control signal line, six of the second level positive polarity switches, six of the second level negative polarity switch and six of the second level control signal lines.

11. A liquid crystal display (LCD) device, comprising a LCD panel and a backlight module, wherein the LCD panel comprises data lines, scan lines, and pixel units disposed between the data lines and the scan lines; the data lines comprise first data lines and second data lines;
    wherein each of odd row pixel units and even row pixel units connects with a same one of the scan lines;
    wherein odd column pixel units of the odd row connect with the first data line, even column pixel units of the odd row connect with the second data line, odd column pixel units of the even row connect with the second data line, even column pixel units of the even row connect with the first data line; and
    wherein the first data line and the second data line are disposed on different sides of the corresponding pixel unit.

12. The LCD device 1 according to claim 11, wherein a polarity of data signal of the first data line and a polarity of data signal of the second data line are inverted.

13. The LCD device according to claim 11, wherein the LCD panel further comprises a data-line driving circuit, the data-line driving circuit comprises a positive polarity signal source, a negative polarity signal source, a first level positive polarity switch, a first level negative polarity switch, a first level control signal line, a second level positive polarity switch, a second level negative polarity switch and a second level control signal line;
    wherein an input terminal of the first level positive polarity switch connects with the positive polarity signal source, a control terminal of the first level positive polarity switch connects with first level control signal line, an output terminal of the first level positive polarity switch connects with an input terminal of the second level positive polarity switch;
    wherein an input terminal of the first level negative polarity switch connects with the negative polarity signal source, a control terminal of the first level negative polarity switch connects with the first level control signal line, an output terminal of the first level negative polarity switch connects with an input terminal of the second level negative polarity switch;
    wherein a control terminal of the second level positive polarity switch connects with the second level control signal line, an output terminal of the second level positive polarity switch connects with the first data line; and
    wherein a control terminal of the second level negative polarity switch connects with the second level control signal line, an output terminal of the second level negative polarity switch connects with the second data line.

14. The LCD device according to claim 13, wherein the positive polarity source corresponds with at least two of the first level positive polarity switches, the negative polarity source corresponds with at least two of the second level negative polarity switches.

15. The LCD device according to claim 14, wherein each of the first level positive polarity switch corresponds at least two of the second positive polarity switches, each of the first level negative polarity switch corresponds at least two of the second negative polarity switches.

16. The LCD device according to claim 15, wherein the data-line driving circuit comprises one of the positive polarity signal source, one of the negative polarity signal source, two of the first level positive polarity switch, two of the first level negative polarity switch, two of the first level control signal line, six of the second level positive polarity switch, six of the second level negative polarity switches and six of the second level control signal lines.

* * * * *